United States Patent [19]
Offner et al.

[11] Patent Number: 4,747,030
[45] Date of Patent: May 24, 1988

[54] ILLUMINATION SYSTEM

[75] Inventors: Abe Offner, Darien, Conn.; Eugene Waluschka, Somers, N.Y.

[73] Assignee: The Perkin-Elmer Corporation, Norwalk, Conn.

[21] Appl. No.: 896,486

[22] Filed: Aug. 13, 1986

[51] Int. Cl.$^4$ .............................................. F21V 1/00
[52] U.S. Cl. ..................... 362/302; 362/17; 362/32
[58] Field of Search ............... 362/3, 16, 17, 32, 298, 362/299, 300, 302

[56] References Cited
U.S. PATENT DOCUMENTS 4,458,302  7/1984  Shiba et al. ................... 362/298 X Primary Examiner—Stephen F. Husar
Attorney, Agent, or Firm—Thomas P. Murphy; Edwin T. Grimes; Francis L. Masselle

[57] ABSTRACT

An optical system for illuminating an arcuate field efficiently and uniformly using a short arc source. A first light source having a length along its axis of symmetry emits light with angular uniformity 360° in azimuth about its axis of symmetry. This light is divided into a plurality of sections of equal angular extent in azimuth and recombined to form adjacent secondary light sources while preserving the uniformity of angular uniformity in each section and simultaneously orienting the sections of light about parallel remote from the first source of light which has a length axes in each section. This forms a second source of light equal to the sum of the lengths of the secondary sources of light with uniform angular distribution over an angular extent of nearly 360° divided by the number of the secondary light sources. By appropriate selection of parameters the difference in the numerical apertures of the illuminated arcuate field is selectable.

28 Claims, 4 Drawing Sheets 4,747,030

ILLUMINATION SYSTEM

BACKGROUND OF THE INVENTION

In projection mask aligners of the type described in U.S. Pat. No. 4,068,947 it is required to illuminate an arcuate field in order to expose a wafer to mask patterns during a scan operation. This is necessary since, as more fully set forth in the above-mentioned patent, the projection optics described therein are fully corrected only within an annular ring concentric with the optical axis. Thus, a light source must illuminate an area of the object plane of the imaging system where optimum imaging properties exist, i.e., the area of the fully corrected annular ring. In actual practice, only an arcuate section of the annular ring is used for imaging purposes with the rest of the ring and remaining field blocked out. Due to the arcuate shape of the area of good imagery, efficiency and uniformity considerations have in the past dictated that the light source used in exposure be arcuate in shape.

In general, the arcuate shaped exposure light source has been obtained by using bent gas discharge tubes as lamps which have a high degree of brightness and which provide radiation in the ultraviolet region of the spectrum required for exposure of the photoresist on a wafer.

Difficulty of manufacture causing high initial costs and short operation life make such lamps a high expense item for device manufacturers. Ideally, use of an ordinary short arc lamp would substantially reduce costs. However, in order to utilize a short arc lamp, means are required to shape the light therefrom in such a way that an arcuate field is illuminated uniformly.

It is known that a band-like section of a spherical mirror or elliptical mirror will convert light from a point light source, such as a short arc lamp, into an arcuate image. For example, see U.S. Pat. No. 3,529,48 issued Sept. 15, 1970 to N. M. Stefano et al "Collector And Method For Producing A Nearly Uniform Distribution Of Flux Density On A Target Plane Perpendicular To The Optical Axis" for use of a band-like portion of a mirror whose surface is a figure of revolution about an axis to form an arcuate image in a plane perpendicular to the axis. U.S. Pat. No. 4,292,663, issued to Martino et al Sept. 29, 1981 for "High Intensity Illumination Light Table" discloses a toroidal elliptical mirror arrangement for forming an arcuate image. U.S. Pat. No. 4,294,538 issued to Ban on Oct. 13, 1981 for "Image Forming Optical System" also discloses the formation of an arcuate image from a point source utilizing a band-like segment of a spherical mirror.

None of these publications treat the essential problem solved by Applicant, i.e., preservation of uniformity of illumination of the short arc lamp in the arcuate image and efficient use of the lamp's light by collecting energy over most of the 360° emission field while at the same time providing uniform imagery by reducing or eliminating the variation of numerical aperture with the azimuth of the imagery.

SUMMARY OF THE INVENTION

In the present invention the radiation emitted by a cylindrically symmetrical source such as a compact arc lamp, whose energy emission is inherently uniform in azimuth about the cylinder axis is converted efficiently into uniformity of illumination along an annular slit. For this purpose, two mirrors which have a common axis of symmetry coincident with the axis of the cylindrically symmetrical light source collect the energy emitted by the source in all directions about its cylindrical axis and, if not intercepted, bring it to a focus at which light is convergent uniformly over 360 degrees in azimuth to an image on the axis of the cylinder. Prior to actual focus at a point on the axis, the light is redirected to an arrangement of rectangular light pipes which collects almost all of the convergent light and forms a unique source image in which the angular uniformity of illumination over a desired range is maintained while at the same time there is an increase in the dimension of the source image in the direction in which the angular distribution of the illumination is uniform. With this source at one of its conjugate foci a preferably spherical mirror illuminates an annular area uniformly in the long direction of the annulus with enhanced numerical aperture in this direction over that which would be obtained with the cylindrically symmetrical source in place of the unique source image.

DESCRIPTION

Figure 1:
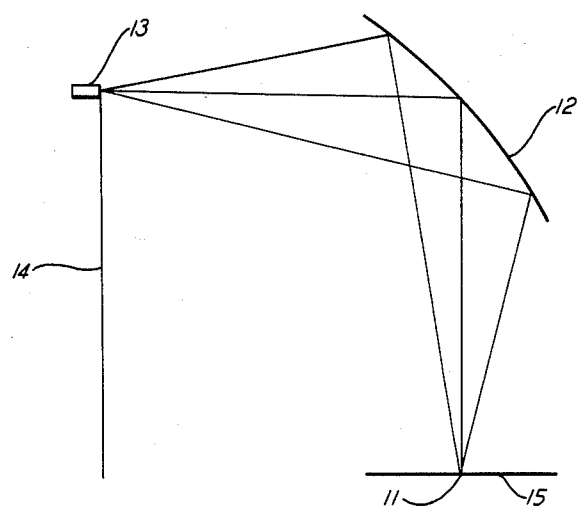
FIG. 1 is a schematic representation of the illumination system of the present invention.
Figure 2:
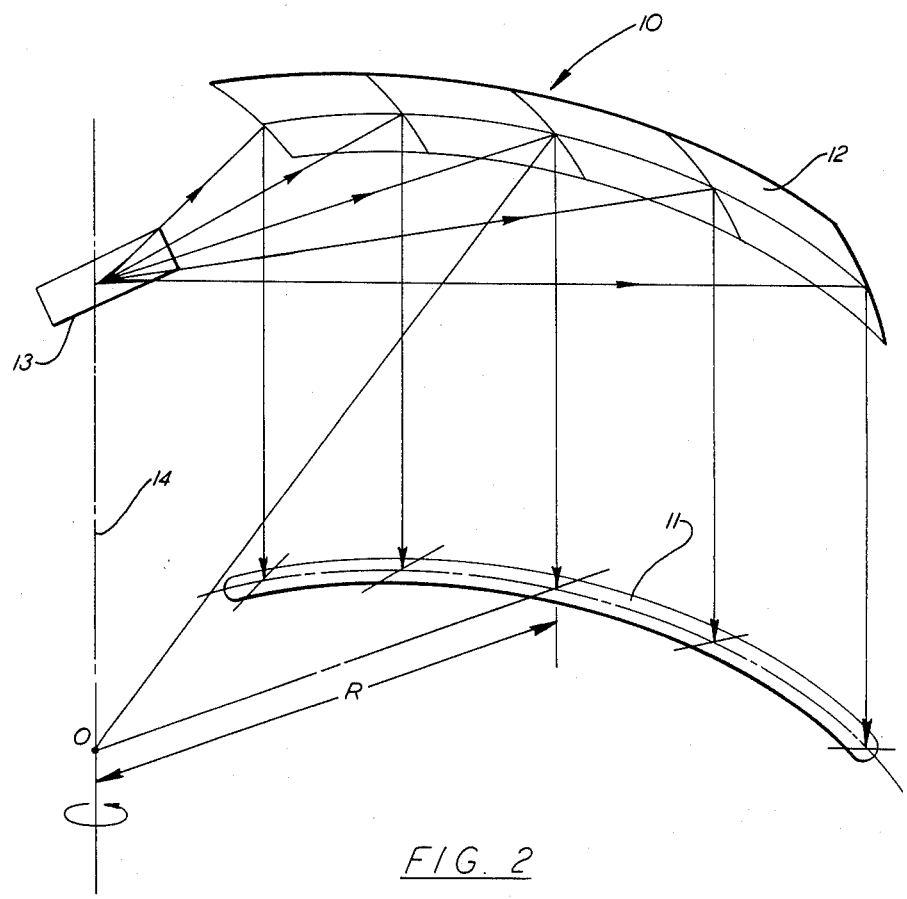
FIG. 2 is a pictorial representation of the illumination system shown schematically in FIG. 1.

Referring to FIGS. 1 and 2 there is shown an illumination system 10 for illuminating an arc, i.e., an arcuate field 11. It essentially comprises a band-like section 12 of a spherical mirror and a light source 13. The light source 13 is located on an axis of symmetry 14 of the spherical mirror away from its center of curvature.

In FIG. 1 an image of light source 13 is focused at plane 15 by the reflector 12. The principal ray from the source 13 is deviated by the reflector 12 so that its direction after reflection is parallel to the axis 14. If the reflector 12 is a surface of revolution about the axis 14, the image of each point of light source 13 will be spread into an arc as can be seen in FIG. 2. The arcuate image 11 is located in plane 15 which is perpendicular to the axis 14. The azimuthal angular extent of the arcuate image 11 about the axis 14 will be equal to the azimuthal divergence of the light from the source 13, i.e., its angular extent in the plane in FIG. 1 perpendicular to the axis 14 which is reflected by the mirror 12. For example, if the azimuthal divergence of the light from source 13 is 72°, the azimuthal angular extent of the arcuate image 11 about axis 14 will be 72°. The illumination will be uniform along the length of the arcuate image if the source emission is uniform in azimuth.

The width of the arcuate image 11 is equal to the linear extent of the source 13 in the vertical direction in the plane of FIG. 1 multiplied by the magnification in this plane of the imagery by the mirror 12. If the mirror 12 is spherical, the preferred magnification is unity.

The numerical aperture of the image 11 in the plane of FIG. 1 is equal to the numerical aperture of the light diverging from the source 13 and reflected by the mirror 12 divided by the magnification in this plane.

As we have seen, in the orthogonal plane containing the principal ray the angular divergence of the light from the source determines the length of the arcuate image. In this plane the numerical aperture is approximately equal to one half the length of the source 13 divided by the distance from the mirror 12 to the image 11.

If the compact arc lamp 18 were to be used as the light source 13, it would have to be arranged with the arc length along the axis 14. The energy emission would then be uniform in azimuth about the lamp, i.e., in the width direction of the arc. However, the linear dimension of the arc in the width direction is always quite small. This results in a low numerical aperture of the imagery in this direction.

Figure 3:
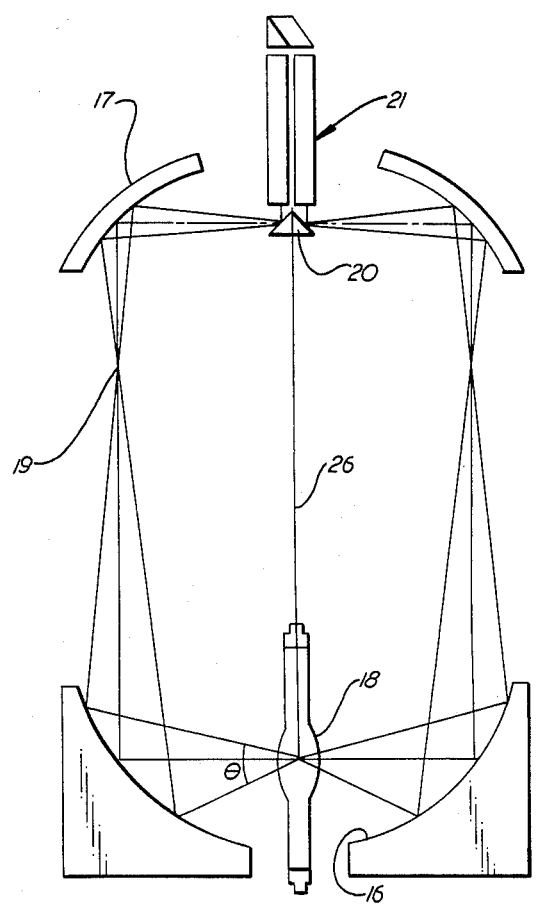
FIG. 3 is a schematic representation of the optics used to form the light source of FIGS. 1 and 2.
Figure 4:
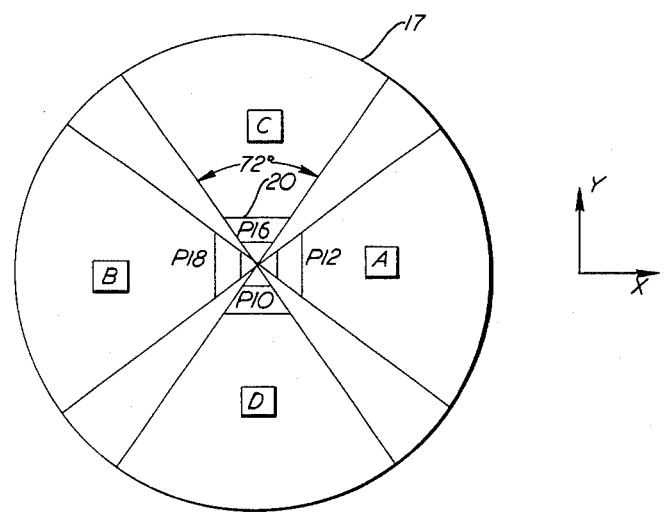
FIG. 4 is a top view of the optical arrangement of FIG. 3.
Figure 5:
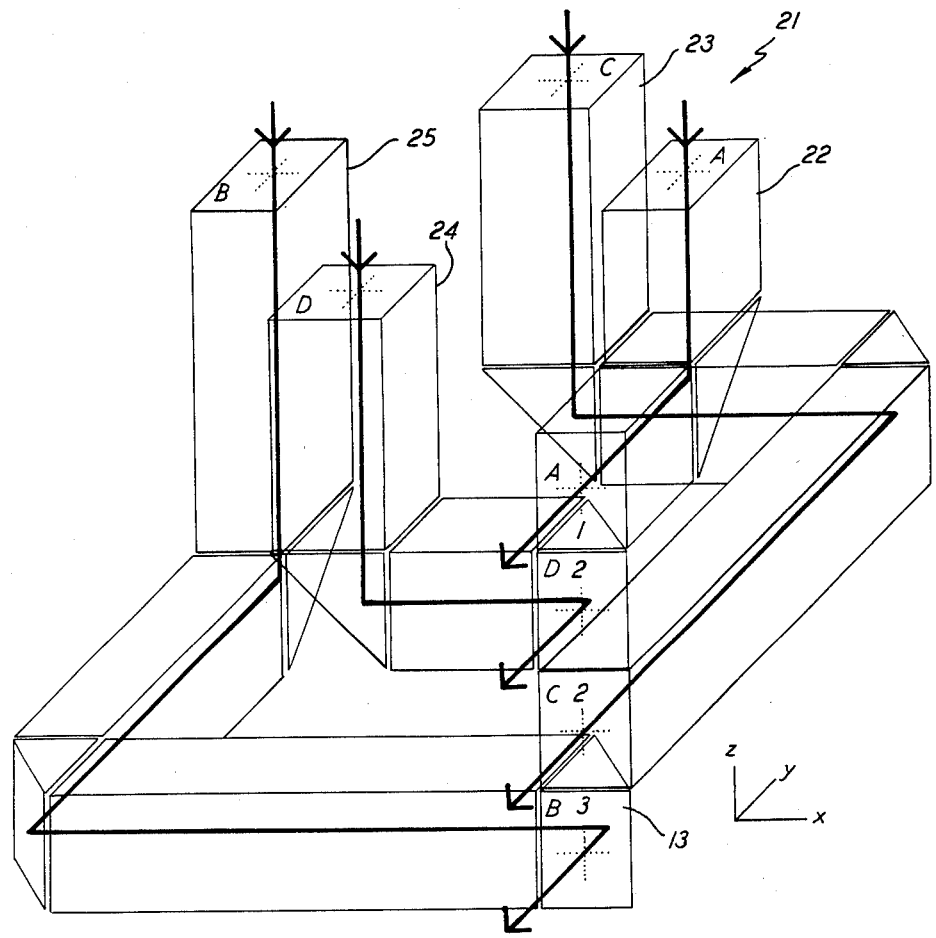
FIG. 5 is a pictorial representation of the light pipe arrangement of the present invention.

FIG. 3 illustrates an optical arrangement which along with the light pipe arrangement of FIG. 5 forms the elongated light source 13. In the plane of FIG. 3 the mirror 16 has conjugate foci at the compact arc of lamp 18 and at 19, while the point 19 and the intersection of the principal rays with the axis 26 are conjugate foci for the mirror 17. Both mirror surfaces 16 and 17 are surfaces of revolution about the axis 26 so that the point 19 is spread into a ring while at the other conjugate of mirror 17 light is incident from all directions as shown in FIG. 4. The section of mirror 16 in the plane of FIG. 3 is preferably elliptic with foci at the arc and at 19. If the chief ray from the compact arc lamp 18 after reflection at mirror 16 is parallel to the axis of symmetry 26, as shown in FIG. 3, mirror 17 is preferably spherical.

The compact arc lamp 18 is located with the arc along the axis of symmetry 26, as shown in FIG. 3. With this orientation, the energy emitted by the lamp is equal in all azimuths about the axis of symmetry so that after reflection at the mirror 16, a ring of uniform brightness is formed in a plane perpendicular to the axis of symmetry 26 which contains the focus 19. The mirror 17, which in this implementation is preferably spherical, converts the ring of uniform brightness to energy converging uniformly in all azimuths to a point on the axis of symmetry 26, as shown in FIG. 4. In the implementation shown in FIGS. 3, 4, and 5, a four sided prism 20 intercepts the light before it comes to a focus on the axis 26 and redirects it so that images of the compact arc of lamp 18 are formed at the entrance faces of the four rectangular light pipes. The arrangement 21 of the four rectangular light pipes, shown in FIG. 5, results in the configuration of the light source 13, shown in FIG. 4, at the exit faces of the rectangular light pipes.

In FIG. 4 it can be seen that the image formed by spherical mirror 17 converges to an image at prism 20. Four 72° bundles A, B, C, and D are deflected by prism sections P1A, P1B, P1C and P1D to the entrance end of the four light pipes. Appropriately placed prisms in the light pipes are used to orient the light to form the light source 13 in which there is a 72° spread in the long dimension. A fuller description of the light pipe arrangement is given below with reference to FIG. 5. As can be seen, the system described in reference to FIGS. 3 and 4 makes use of four-fifths, i.e., 288° of the light in azimuth about the short arc lamp 18 and is, therefore, highly efficient. The rectangular light pipes preserve the uniformity of the light in the long direction, i.e., the direction of the 72° spread such that light intensity is uniform over the long dimension of the illuminated arcuate field 11. For a desired angular spread other than 72° the number of faces of prism 20 and the equal number of rectangular light pipes can be changed.

At the same time the increase in numerical aperture in the length direction of the illuminated area resulting from the increased width of source 13 as compared to arc lamp 18 decreases or eliminates the difference in numerical apertures of the illumination of the annular region in the length and width directions. If all of this light is to be put into an annular field projection system, the difference in the portion of the pupil of the projection systems which is filled in two orthogonal directions is reduced or eliminated. The difference in the degree of partial coherence in two orthogonal directions is thus reduced or eliminated and if the system is used for the exposure of wafers in a projection mask aligner, the line width control in two orthogonal directions is enhanced. Introduction of a circular stop at the pupil of such a system can make the partial coherence effectively independent of azimuth at the cost of a moderate reduction of the energy supplied by the illumination system.

FIG. 5 illustrates a light pipe arrangement which reorients the light coming off the prism 20 into the entrance faces of the four rectangular light pipes to form the light source 13 in which light is emitted uniformly over 72° in a plane containing the long dimension of the light source.

As seen above light is uniform in azimuth in the plane of FIG. 4. After reflection off prism faces P 1A and P 1B the 72° beams are angularly uniform in the plane perpendicular to the Y axis. The 72° beams reflected by the faces P 1C an P 1D of prism 20 are angularly uniform in the plane perpendicular to the Y-axis.

As seen in FIG. 5, the light entering light pipe 22 enters in the z direction with its uniform 72° divergence in the y direction. A reflecting face at 45° deviates it so that it proceeds in the y direction with its 72° uniform spread in the z direction. The light entering light pipe 23 enters in the z direction with its 72° divergence in the x direction. A reflecting face at 45° redirects it to the x direction with its 72° spread in the z direction. A second 45° reflecting face redirects it to the y direction with its 72° spread in the z direction and its exit face adjacent to that of light pipe 24. Similarly, light enters light pipe 24 in the z direction with 72 divergence in the x direction. Two reflecting faces at 45° redirect it to the y direction with its 72° spread in the z direction and its exit face adjacent to those of light pipes 22 and 24. Light enters light pipe 25 in the z direction with its 72° spread in the y direction. Three reflecting faces at 45° redirect it to the y direction with its 72° spread in the z direction and its exit face adjacent to that of light pipe 23. Since all the reflections in the rectangular light pipes and 90° prisms are at plane surfaces, the uniformity of the energy with angle in the long (y) direction of the source image 13 is preserved. The four sections A, B, C and D of light source function effectively as a single elongated light source and the light emanating therefrom form the illuminated arcuate field when positioned as previously described in reference to FIGS. 1 and 2.

As previously indicated, the light emanating from the arc lamp 18 is uniform over 360° in azimuth. When the light is divided into 72° sections by prism 20, that uniformity is maintained in each 72° section. The light pipe arrangement recombines the sections to form the elongated light source 13 comprising the four end sections A, B, C and D. The light pipe arrangement preserves the angular uniformity of each 72° portion and causes the light from each end section A, B, C and D to be oriented so that this uniformity is in the same direction, i.e., the long direction of the elongated source 13 or, in other words, the angular uniformity of light distribution is oriented about parallel axes running in the short dimension of each of said sections.

An inherent problem associated with light pipes wherein light is bent via a series of folding elements, e.g., reflecting prisms is the possible degradation in the uniformity of exiting light. In the present invention this problem is remedied by providing gaps between the reflecting prism and the light pipes, as described below.

Figure 7:
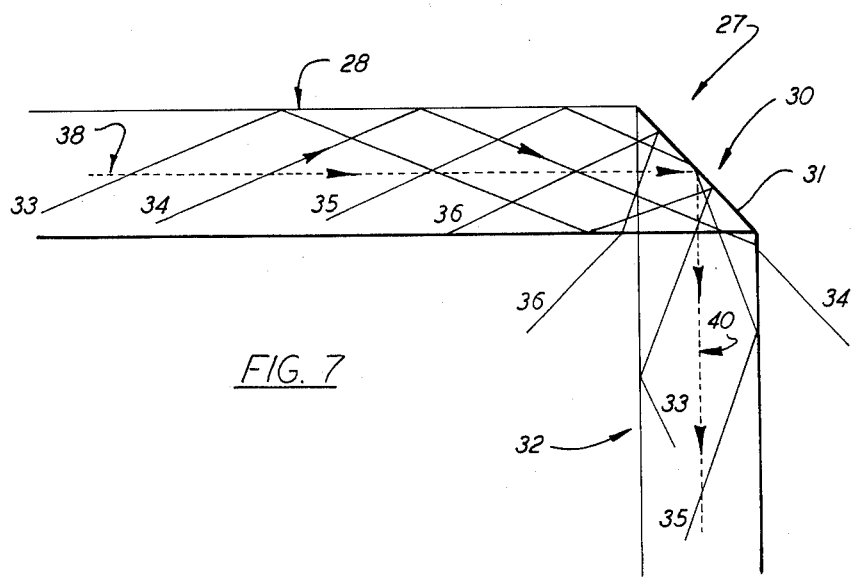
FIG. 7 is a side view of a light pipe showing a prismatic fold.
Figure 8:
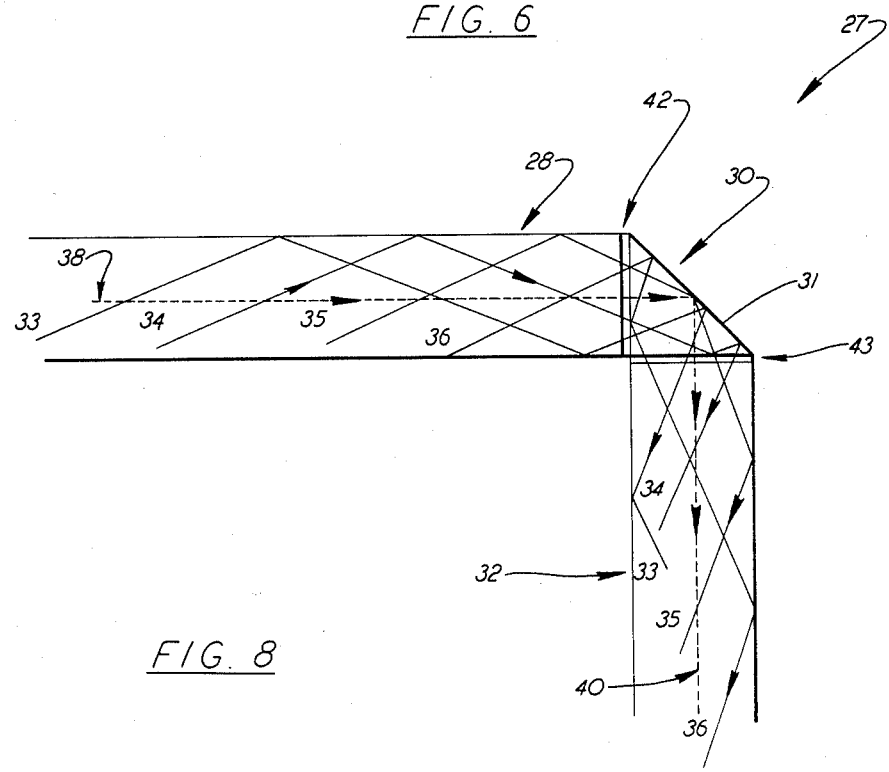
FIG. 8 is a side view of a light pipe showing a prismatic fold in accordance with the present invention.

FIG. 7 shows a particular technique for folding the above-described light pipes which is useful in understanding Applicants' innovation discussed in reference to FIG. 8.

A light pipe 27 is folded by a right-angle reflecting prism 30. In this manner the energy in light pipe potion 28, represented by rays 33-36 can be folded by the prism 30 into another light pipe portion 32. Light parallel to the axis 38 in portion 28 is reflected by a reflecting surface 31 in prism 30 and continues in portion 32 parallel to axis 40. Of the light not parallel to the axis 38, a certain amount is not folded into portion 32 in the proper direction. As an example, consider rays 33-36 which make equal angles with the axis 38 through portion 28. Rays 33 and 35 are folded by the prism 30 and continue through portion 32 at the proper angle with respect to the axis 40. By proper angle is meant that angle which retains the desired divergence to be delivered to the exit face of the light pipe 27. In the example given hereinabove in reference to FIGS. 1-3, the proper angle was 72°. Rays 34 and 36 do not enter portion 32 with the proper angle. Ray 34 reaches portion 32 without reflection at the prism 30 and is thus incident on the face of portion 32 at the wrong angle. It is not totally reflected and most of the energy represented by ray 34 escapes from the light pipe 27. Ray 36 is reflected at the reflecting surface 31 of the prism 30 but its path after reflection is back into portion 28 instead of into portion 32. Thus, most of the energy represented by ray 36 also escapes from the light pipe 27.

FIG. 8 shows the folded light pipe 27 of FIG. 7 with the addition of gaps 42 and 43 between the prism 30 and portions 28 and 32, respectively.

Ray 34, in contrast to the result illustrated in FIG. 7 is now totally reflected at the surface of the prism 30 adjoining the gap 43. It is then incident on the reflecting surface 31 of the prism 30 and reflected into portion 32 at the proper angle. Similarly, by introducing a gap 42 at the interface between portion 28 and prism 30, the ray 36 is reflected at the interface and proceeds into portion 32 at the proper angle. With the addition of these gaps 42 and 43, the paths of all the rays at any angle with te axis 38, which is transmitted by portion 28, are folded into paths in portion 32 in which paths their proper angle with the axis 40 is preserved. For best results the gaps should be on the order of two to three wavelengths of light in thickness.

The foregoing described light pipe innnovation is described more fully in an application Ser. No. 896,550, now abandoned, entitled "Folded Rectangular Prismatic Light Pipe" filed concurrently with the present application and having a common Assignee.

In a particular example of the present invention, the annular projection systems required an illuminated 72° arcuate area with a 3 inch radius and 0.2 inch slit width. A numerical aperture of 0.05 was required to achieve the desired degree of partial coherence. A spherical mirror at unit magnification was chosen as the mirror 12 so that the distance from the mirror 12 to the arcuate illuminated area 11 was also 3 inches. To achieve the desired numerical aperture in the slit length direction, a source 13 with 0.3 inch as its longated dimension (FIG. 2) was required. For this purpose a compact arc with arc diameter 0.075 inches was chosen as the source. A system similar to that shown in FIGS. 3, 4 and 5 was used to form the source image 13 of the desired elongated dimension. The mirror 16 was a toroidal ellipse with foci at the lamp 18 and the annulus 19 with magnification 4×. The mirror 16 was a surface of revolution about the axis 26. The mirror 17 was spherical and used at 1× magnification. Choosing a pick-up numerical aperture (sin $\theta/2$ in FIG. 3) equal to 0.2 resulted in a numerical aperture in the slit width direction also equal to 0.05. To obtain a slit width of 0.05" the portion of the length of the arc of lamp 18 used was 0.0125 inch. This small dimension is desirable since it allows the use of the brightest part of this non-uniform source.

Figure 6:
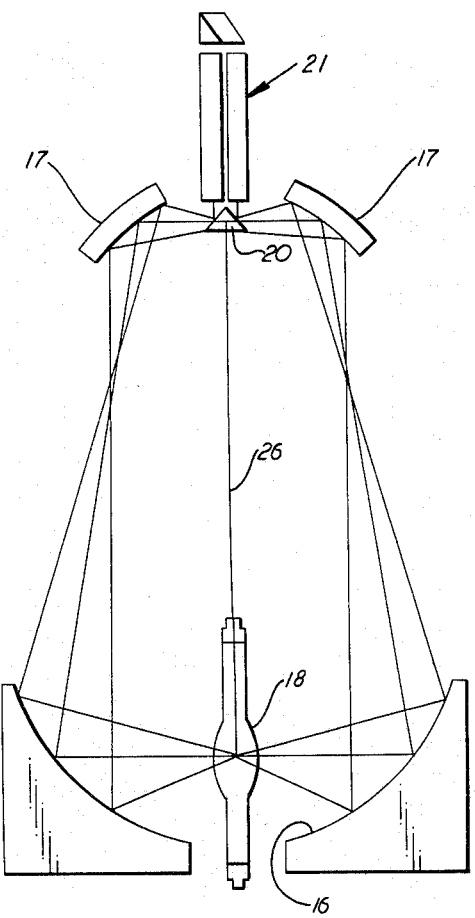
FIG. 6 is a schematic representation of another embodiment of the optics used to form the light source of FIGS. 1 and 2.

In the example shown in FIG. 3 and described above, in the system used for forming the image 13, the principal ray after reflection by the mirror 16 is parallel to the axis 26. FIG. 6 shows an arrangement for accomplishing the same result in which the chief ray after reflection at mirror 16 is not parallel to the axis 26.

It is to be noted that in both the systems of FIG. 3 and FIG. 4 the principal rays after reflection at the mirror 17 are perpendicular to the axis of symmetry 26 so that there is a plane, as shown in FIG. 4, which contains the principal rays of the energy which is convergent uniformly in azimuth on the prism 20.

Other modifications of the present invention are possible in light of the above description which should not be construed as limiting the invention beyond those limitations expressly set forth in the claims which follow.

What is claimed is:

1. An illumination system, comprising:
   a first light source having a length along an axis of symmetry emitting light with angular uniformity in a 360° azimuth about said axis of symmetry;
   first means dividing said azimuthally uniform light into a plurality of sections equal in azimuthal extent;
   second means recombining said sections into adjacent secondary light sources such that said angular uniformity of light distribution is preserved and oriented about parallel axes in each of said secondary light sources;
   whereby said uniform 360° azimuthal emission of said first light source is converted into a second light source having an area equal to the sum of areas of said secondary light sources.

2. An illumination system, comprising:
   a first light source having a length along an axis of symmetry emitting light with angular uniformity in a 360° azimuth about said axis of symmetry;
   first means dividing said azimuthally uniform light into a plurality of sections equal in azimuthal extent;
   second means recombining said sections into adjacent secondary light sources such that said angular uniformity of light distribution is preserved and oriented about parallel axis in each of said secondary light sources;

whereby said uniform 360° azimuthal emission of said first light source is converted into a second light source having a length equal to the sum of lengths of said secondary light sources with uniform angular distribution over an angular extent of nearly 360° divided by the number of said secondary light sources.

3. An illumination system according to claim 2 wherein said first means comprises:
first and second mirror means having a common axis of symmetry;
said first light source disposed adjacent said first mirror means with its axis of symmetry coincident with said common axis of symmetry;
said first and second mirror means and said first light source so disposed that a 360° converging image of said first light source is focused at a point on said common axis of symmetry by said second mirror means.

4. An illumination system according to claim 3 wherein said first means further including:
prism means disposed at said point on said common axis dividing said azimuthally uniform light into said plurality of sections and directing said sections of light away from said point.

5. An illumination system according to claim 4 wherein said second means comprises:
a like plurality of light pipes;
each of said light pipes having an entrance end adjacent said prism means for receiving one of said plurality of sections of light and an exit end which together with the exit ends of the other of said plurality of light pipes are said secondary light sources which form said second light source.

6. An illumination system according to claim 5 wherein one or more of said light pipes comprise:
at least one right angle prism having a mirrored hypotenuse face disposed for redirecting light propagating through said light pipes;
said right angle prism having an entrance face and an exit face;
said light pipes having an exit face adjacent to but separated by a predetermined gap distance from said entrance face of said right angle prism and an entrance face adjacent to but separated by a predetermined gap distance from said exit face of said right angle prism.

7. An illumination system according to claim 5 wherein said first light source comprises:
a short arc lamp having an axis of symmetry coincident with said common axis of symmetry of said first and second mirror means.

8. An illumination system according to claim 7 wherein said second mirror means comprises;
a spherical mirror.

9. An illumination system according to claim 8 wherein said first mirror means comprises:
a spherical mirror.

10. An illumination system according to claim 9 wherein said first mirror means comprises:
a toroidal formed by rotating an ellipse about an axis coincident with said common axis of symmetry which intersects the ellipse axis at one focus of the ellipse at an angle other than zero.

11. An illumination system according to claim 10 wherein:
said short arc lamp is located at said one focus.

12. An illumination system according to claim 11 further comprising:
a reflecting optical system having an axis of symmetry;
said second light source disposed on said axis of symmetry forming an illuminated arcuate field at a plane perpendicular to said axis of symmetry with light reflected by said reflecting optical means.

13. An illumination system according to claim 12 wherein:
the light pick-up angle of said toroid and the length of said second light source may be chosen such that any difference between the numerical apertures of the arcuate field in orthogonal directions may be fixed at any desired amount up to and including zero.

14. An illumination system, comprising:
a reflecting optical system having an axis of symmetry;
an elongated source of light disposed on said axis of symmetry and having uniform angular distribution about said axis of symmetry;
said source of light disposed relative to said reflecting optical system to illuminate an arcuate field having predetermined numerical apertures in two orthogonal directions.

15. An illumination system according to claim 14 wherein said reflecting optical system comprises:
a band like section of a spherical mirror having a center of curvature on said axis of symmetry.

16. An illumination system according to claim 15 further including;
a short arc lamp;
optical means for converting light from said short arc lamp into said source of uniform angular distribution of light.

17. An illumination system according to claim 16 wherein said optical means comprises:
first and second mirror means have a common axis of symmetry;
said short arc lamp disposed on said axis of symmetry adjacent said first mirror means;
said first and second mirror means and said short arc lamp so disposed that a 360° converging image of said short arc lamp is formed at said axis of symmetry by said second mirror means,
light pipe means disposed at the point on said axis symmetry where said converging image of said short arc lamp is formed by said second mirror means for forming said elongated light source at a position remote from said second mirror means.

18. An illumination system according to claim 17 wherein;
said arcuate field is illuminated in a plane perpendicular to said axis of symmetry.

19. An illumination system according to claim 18 wherein said second mirror means comprises;
a spherical mirror.

20. An illumination system according to claim 19 wherein said first mirror means comprises;
a spherical mirror.

21. An illumination system according to claim 20 wherein said first mirror means comprises;
a toroid formed by rotating an ellipse about an axis coincident with said axis of symmetry which intersects the ellipse axis at one focus of the ellipse and at an angle other than zero.

22. An illumination system according to claim 21 wherein;
said short arc lamp is located at said one focus.

23. An illumination system according to claim 22 wherein;
the light pick-up angle of said toroid and the length of said elongated source of light may be selected so that any difference between the numerical apertures of the arcuate field in orthogonal directions can be fixed at any desired amount up to zero.

24. An illumination system according to claim 19 wherein;
the light pick-up angle of said spherical mirror and the length of said elongated source of light may be selected so that any difference between the numerical apertures of the arcuate field in orthogonal directions can be fixed at any desired amount up to zero.

25. An illumination system according to claim 24 wherein said light pipe means comprises:
four rectangular light pipes;
four sided reflecting prism means disposed to direct equal portions of said converging image from second mirror means into one end of respective ones of said light pipes;
the other end of said light pipes arranged in four contiguous sections forming said elongated light source;
said four rectangular light pipes including means for orienting the portions of said converging image such that each of said four sections provide a light output which is angularly uniform in the plane of the long dimension of said elongated light source at a diverging angle equal to the angle of said equal portions of said converging image.

26. An illumination system according to claim 23 wherein the difference between said numerical apertures approaches zero.

27. An illumination system according to claim 20 wherein the difference between said numerical apertures approaches zero.

28. An illumination system according to claim 25 wherein one or more of said light pipes comprise:
at least one right angle prism having a mirrored hypotenuse face disposed for redirecting light propagating through said light pipes;
said right angle prism having an entrance face and an exit face;
said light pipes having an exit face adjacent to but separated by a predetermined gap distance from said entrance face of said right angle prism and an entrance face adjacent to but separated by a predetermined gap distance from said exit face of said right angle prism.

* * * * *